(12) United States Patent
Flegeo

(10) Patent No.: US 6,384,324 B2
(45) Date of Patent: *May 7, 2002

(54) ELECTROMAGNETIC SHIELDING SCREEN AND CIRCUIT SUPPORTING SUBSTRATE FITTED OUT WITH SUCH A SCREEN

(75) Inventor: Arnaud Flegeo, Challes (FR)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/408,784

(22) Filed: Sep. 30, 1999

(30) Foreign Application Priority Data

Oct. 6, 1998 (FR) .............................. 98 12496

(51) Int. Cl.[7] .................................. H05K 9/00
(52) U.S. Cl. ............... 174/35 GC; 174/35 R; 361/752; 361/816
(58) Field of Search .................. 174/35 R, 35 GC; 361/816, 818, 752, 753

(56) References Cited

U.S. PATENT DOCUMENTS

| | | | | |
|---|---|---|---|---|
| 5,614,694 A | * | 3/1997 | Gorenz, Jr. et al. | 174/35 R |
| 5,704,117 A | * | 1/1998 | Mok et al. | 29/841 |
| 5,907,471 A | * | 5/1999 | Patel et al. | 361/500 |
| 6,002,086 A | * | 12/1999 | Yajima | 174/35 R |

OTHER PUBLICATIONS

Japanese Abstract: Publication # 06338695 A Date of Publication: Jun. 12, 1994, Int. Class H05K 9/00.

* cited by examiner

Primary Examiner—Dean A. Reichard
Assistant Examiner—Hung V Ngo
(74) Attorney, Agent, or Firm—Dicran Halajian

(57) ABSTRACT

A device shielding a circuit located over a substrate includes a band formed from side faces of the device for encompassing the circuit. A top surface of the shielding device is removably located over the band. The side faces are inclined to allow stacking of another shielding device on the band of the original shielding device after removal of the top surface while maintaining shielding of the circuit.

15 Claims, 1 Drawing Sheet

US 6,384,324 B2

ELECTROMAGNETIC SHIELDING SCREEN AND CIRCUIT SUPPORTING SUBSTRATE FITTED OUT WITH SUCH A SCREEN

FIELD OF THE INVENTION

The present invention relates to an electromagnetic shielding screen for at least one electronic circuit disposed on a substrate, having side faces called vertical faces that form a band, and a face called upper face whose edges coincide with the upper edges of said vertical side faces, the band and the upper face being realized at least partly of an electrically conducting material and forming a sub-set provided for being applied against the supporting substrate of the circuit to be shielded.

BACKGROUND OF THE INVENTION

Apparatus operating at high frequency, such as wireless telephones (called residentials), or mobile telephones (called cellulars), are to comprise shielding screens for components (electronic circuits) radiating at high frequency, so as to avoid the latter having disturbing electromagnetic influences. A known structure of such a shielding screen often consists of a band and a cap covering it, which together form a sub-set provided for being applied against the printed circuit board (or other support of the circuit to be shielded such as a ceramic substrate for a hybrid circuit, for example). This sub-set is realized at least partly with an electrically conducting material so as to realize a kind of Faraday cage for the protection of the circuit. Making the shielding in two separate parts permits to have access to the protected circuits, as required, notably for repair purposes, in which case the cap is opened.

The linking modes habitually found for fixing the cap onto the band are soldering, in which case the link is irreversible (or at least implies comparatively extensive practical manipulations), or solutions are used of the type in which strips or sliding members are used to form a spring and provide that the cap is locked to the band. This type of linking can easily be dismantled this time, but the attempts made show that shakes or shocks exerted on the structures thus realized often lead to the unwanted opening of the cap. Moreover, the fact that two parts are to be manufactured and then controlled as regards storage and positioning on the supporting substrate, brings with it extra cost compared with a shielding screen that would be formed by a single part, this aspect of the matter having much weight for consumer hardware—as this is, in essence, the case here—of which the price is to be the lowest possible.

From Japan patent application JP-A-06 338695 is known an electromagnetic shielding screen whose upper surface is precut along a closed line of holes forming a dotted line, so as to be able to lift this upper surface when a component underneath it is to be replaced. However, a specific part must be provided for closing the screen again after repair, while this new part must permit to be clipped or soldered onto the remaining band, with the drawbacks cited and described above when the shielding screen consists of a band and a cap.

SUMMARY OF THE INVENTION

It is an object of the invention to realize an electromagnetic shielding screen that is made of a single part while permitting easy repair of the electronic components it protects.

It is another object of the invention to realize an electromagnetic shielding screen resistant to shocks and of low cost.

These objects are achieved and the prior-art drawbacks are mitigated thanks to the fact that the electromagnetic shielding screen indicated in the opening paragraph is characterized in that said band has a slightly pyramidical shape, while said side faces form an angle comprised between 92 degrees and 94 degrees relative to said upper face and in that said upper face has a precut running in parallel with and in proximity of its edges.

The shielding screen is preferably made of sheet steel and the precut of the upper face may be made either by a succession of holes lying close together, or, preferably, by partly cutting away the central part of the upper face, either operation being realized during the embossing of sheet steel that gives its shape to the screen. For repairing a circuit closed in by the screen, it is sufficient to lift the central precut part with any known means, to carry out the repair and then take a new screen that is identical with the original one and stamp it with force on that which remains of the original screen, that is to say, the side band, while the positioning by clamping is ensured by the steep slopes of the faces that form the band.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

The shielding screen structures represented in FIGS. 1 to 4 are intentionally enlarged in order to better show the details relative to which they are typical of their application, which is that of mobile telephones and wireless telephones, it being understood that for the latter application such screens are present both in the handsets and in the base station.

Figure 1:
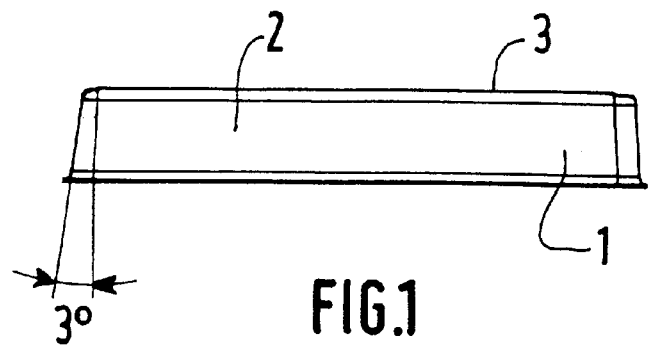
FIG. 1 is a side view of the shielding screen according to the invention.
Figure 2:
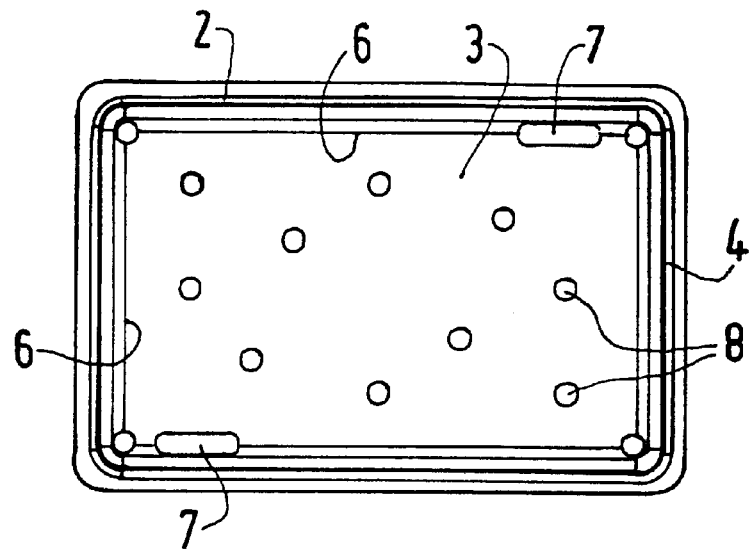
FIG. 2 is a top plan view of the shielding screen shown in FIG. 1.

The screen structure of the FIGS. 1 and 2 consists of 4 side faces such as 1 constituting a band 2 that has a horizontal section in the form of a rectangle with rounded corners, and an upper face 3 whose edges 4 coincide with the upper edges of the side faces. The screen is realized of an electrically conducting material, preferably steel. As steel may be used, for example, tin-plated C1T-50 E4/E4, having a thickness of 0.2±0.05 mm. According to the invention, the band 2 has a slightly pyramidical shape, the 4 side faces such as 1 forming an angle comprised between 92 and 94 degrees relative to the upper face 3, and the upper face 3 has a precut 6 running in parallel with and in the proximity of its edges 4. Preferably, the side faces 1 form an angle comprised between 92 degrees 50 arc minutes and 93 degrees 20 arc minutes relative to the upper face 3. The precut 6 may be obtained by partly cutting away the central portion of the upper face 3, by stamping, as this can be seen in FIG. 3; in a manner not shown, the precut could also consist of holes lying close together along the unbroken line 6, also obtained by stamping sheet steel. Preferably, at least one hole (oblong) 7, having a diameter from 1 to several millimeters is provided by stamping along the precut 6 that runs across the upper face. This permits, with a suitable tool, or with a fingernail, to pull up the main part of the upper face, if necessary. Preferably, the upper face 3 has various holes such as 8. This facilitates the refusion operation in SMC technique (Surface-Mounted Components). This known technique consists of precisely silk-screen printing a paste to be soldered onto contact areas of a printed circuit or ceramic circuit in view of the later soldering of components according to a refusion method the soldering paste which forms the silk-screen product being formed, for example, by small balls of an alloy of Pb—Sn of several microns in diameter, agglomerated by means of a binder that gives this paste thixotropic qualities. As the case may be, the shielding screen is fixed to its support in the same way as the other components. However, during the refusion, it forms in a parasitic way a thermal screen relative to the components it covers; the holes 8 permit to mitigate the difference of temperature (of the order of 10 degrees at about 240 degrees) that exists between the inside and outside of the shielding screen during the refusion; these holes, however, are not indispensable on condition that the sheet steel that constitutes the screen is thin enough, which is generally the case (0.15 or 0.2 mm thickness). When the screen has holes such as 7 and 8, the diameter of these holes is to be small enough not to be harmful to the "Faraday Cage" effect that the screen is intended to constitute. In a more or less empirical way, the diameter of the holes is chosen to be lower than one twentieth of the wavelength of the electromagnetic radiation of the components to be protected. For a wireless telephone handset or its base station, this results in holes having a diameter of the order from one to several mm (frequencies of the order of 2 GHz). Preferably, the shielding screen represented in FIGS. 1 and 2 is manufactured in a single embossing operation giving it its shape, and realizes the precut 6 and the holes 7 and 8, if any. The shielding screen is generally disposed on a printed circuit board, for example, of epoxy glass or a ceramic support (at 11, FIGS. 3 and 4). Preferably, to avoid undesirable mechanical constraints between the screen and its support after the refusion, the materials that constitute the screen and its support are chosen, so that they have substantially the same coefficient of expansion.

Figure 3:
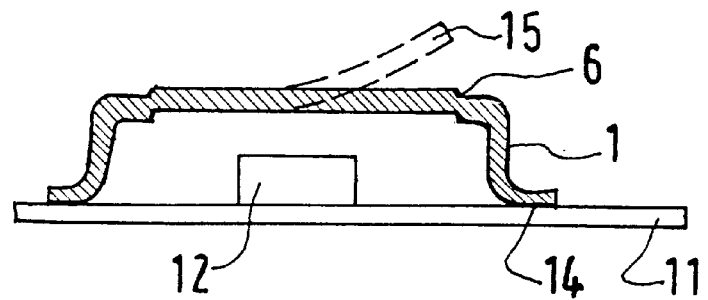
FIG. 3 represents in a cross-sectional view a first shielding screen according to the invention disposed on a printed circuit board or a ceramic support.
Figure 4:
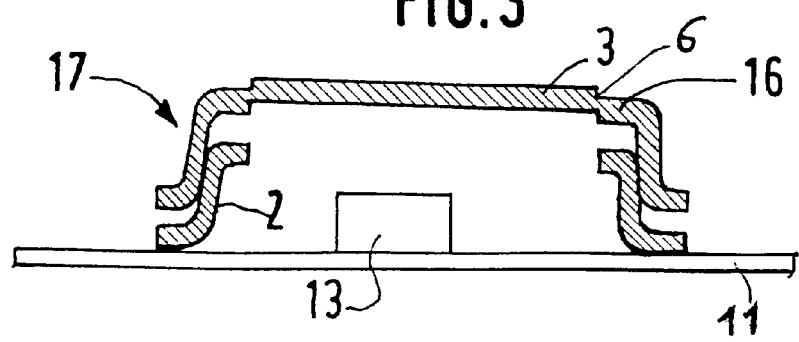
FIG. 4 represents in a cross-sectional view a second shielding screen combination according to the invention, disposed on a printed circuit board or a ceramic support.

The FIGS. 3 and 4 show how a repair can be done, that is to say, the replacement of a defective component 12 (FIG. 3) by a new component 13 (FIG. 4). To do this, as the shielding screen is soldered on its inside edges 14 to a metallic track of the supporting substrate 11, the central part of its upper face is pulled up and thrown away as represented in a broken line 15 in FIG. 3, which central part is pulled out at the level of the precut 6. Then, the electronic circuit is unsoldered, withdrawn and replaced by the new circuit 13; thereafter a new screen 16, similar to or identical with the (original) one represented in FIG. 1, is fitted in with force on that which remains of the original screen, that is to say, the side band 2, while the clamping in its place is ensured by the steep gradients of the faces that form the band 2. The result is a new combined shielding screen 17, formed by the assembly of the elements 2 and 16, and raised by 1 to 2 mm relative to the original screen, for a screen whose height is equal to about 4 mm, which combined screen well satisfies the habitual tests as regards mobile or wireless telephone handsets, notably the vibration tests and the tests of a shock after a fall. The screen 16 may be manually clamped onto the band 2, preferably by simultaneously pushing on the 4 corners, or by means of a more or less specific tool that is easy to design for those skilled in the art (a tool comprising a flattened end, for example, to be pressed against the upper face of the screen 16). If it turned out to be necessary to replace the circuit 13 by a new one, it would be possible to start the operations again that permit to change from the screen of FIG. 3 to the combined screen of FIG. 4; however it is to be preferred to separate the parts 2 and 16 with the fingernail or a screwdriver and to throw away the screen 16 that runs the risk of getting warped, which brings us to the step of the previous separation where one has pulled up and thrown away the central part of the upper face 3 of the first shielding screen firmly attached to the support 11.

The invention thus permits to realize a shielding screen in a single stamping operation in one piece with automatic fixing, and which permits to repair the underlying component(s) in a simple way, causing about half the cost of prior-art screens.

In addition to mobile and residential telephony, the invention may be applied to high-frequency radio transmitters and/or receivers, notably to DAB (Digital Audio Broadcasting).

What is claimed is:

1. A device for shielding a circuit located over a substrate comprising:
   a plurality of bands stacked over each other, wherein each of said plurality of bands are formed from side faces that encompass said circuit, said side faces being inclined to allow stacking of said plurality of bands and maintaining shielding of said circuit; and
   a top surface which is located over an upper one of said plurality of bands.

2. The device of claim 1, wherein said side faces form an angle between 92 degrees 50 arc minutes and 93 degrees 20 arc minutes relative to said top surface.

3. The device of claim 1, wherein said top surface has at least a hole having a length of at least 1 mm, disposed along edges of said top surface.

4. The device of claim 1, wherein said top surface has at least one hole having a diameter of at least 1 mm, disposed across said top surface.

5. The device of claim 1, wherein said device is realized of deep-drawn steel, in a single embossing operation.

6. The device of claim 1, wherein said device is mounted on said substrate around and over said circuit by refusion of a soldering paste in SMC technique.

7. The device of claim 1, wherein said device is realized of sheet steel whose coefficient of expansion is substantially equal to that of said substrate.

8. The device of claim 1, wherein each of said plurality of bands has a pyramidical shape and said top surface is removable.

9. The device of claim 1, wherein said top surface has a precut running in parallel with and in proximity of edges of said top surface.

10. The device of claim 1, wherein said side faces form an angle between 92 degrees and 94 degrees relative to said top surface.

11. The device of claim 1, wherein said side faces are pyramidical.

12. The device of claim 1, wherein said top surface includes at least one hole.

13. The device of claim 12, wherein said at least one hole is located along an edge of said top surface.

14. The device of claim 12, wherein said at least one hole is located along across said top surface.

15. A support for a circuit, wherein said support is equipped with the device of claim 1 for the protection of said circuit.

* * * * *